(12) United States Patent
Chuang et al.

(10) Patent No.: US 10,673,194 B2
(45) Date of Patent: Jun. 2, 2020

(54) MANUFACTURING METHOD OF CONNECTOR STRUCTURE

(71) Applicant: Unimicron Technology Corp., Taoyuan (TW)

(72) Inventors: Yu-Hsiang Chuang, Taoyuan (TW); Guodong Li, Guangdong (CN); He Lei, Guangdong (CN); Jianyu Zhang, Guangdong (CN)

(73) Assignee: Unimicron Technology Corp., Taoyuan (TW)

( * ) Notice: Subject to any disclaimer, the term of this patent is extended or adjusted under 35 U.S.C. 154(b) by 179 days.

(21) Appl. No.: 16/055,160

(22) Filed: Aug. 6, 2018

(65) Prior Publication Data

US 2020/0006906 A1    Jan. 2, 2020

(30) Foreign Application Priority Data

Jun. 27, 2018  (CN) .......................... 2018 1 0677328

(51) Int. Cl.
*H01R 43/00* (2006.01)
*H01R 12/55* (2011.01)

(52) U.S. Cl.
CPC ........... *H01R 43/007* (2013.01); *H01R 12/55* (2013.01)

(58) Field of Classification Search
None
See application file for complete search history.

(56) References Cited

U.S. PATENT DOCUMENTS

| 7,371,073 | B2 * | 5/2008 | Williams | H01R 13/2407 |
| | | | | 439/66 |
| 8,708,711 | B2 * | 4/2014 | Horikawa | H01R 12/52 |
| | | | | 439/66 |
| 9,680,273 | B2 * | 6/2017 | Light | H01R 43/16 |
| 2007/0259539 | A1 * | 11/2007 | Brown | H01R 43/16 |
| | | | | 439/66 |

(Continued)

FOREIGN PATENT DOCUMENTS

| TW | 201322560 | 6/2013 |
| TW | I464968 | 12/2014 |

OTHER PUBLICATIONS

Office Action of Taiwan Counterpart Application, dated Jan. 22, 2019 pp. 1-4.

*Primary Examiner* — Jeffry H Aftergut
(74) *Attorney, Agent, or Firm* — JCIPRNET

(57) ABSTRACT

A manufacturing method of connector structure including the following steps is provided. First, providing a dielectric layer having. Then, forming a first adhesive layer and a second adhesive layer on two opposite sides of the dielectric layer respectively. Then, providing at least one first conductive elastic cantilever and at least one second conductive elastic cantilever, wherein the first conductive elastic cantilever comprises a first fixing end portion and a first free end portion, and the second conductive elastic cantilever comprises a second fixing end portion and a second free end portion. Then, fixing the first fixing end portion and the second fixing end portion to the first adhesive layer and the second adhesive layer respectively, wherein the first fixing end portion is aligned with the second fixing end portion. Afterward, forming at least one conductive via for electrically connecting the first conductive elastic cantilever with the second conductive elastic cantilever.

6 Claims, 6 Drawing Sheets

(56) References Cited

U.S. PATENT DOCUMENTS

2012/0024584 A1* 2/2012 Lee ..................... H05K 3/4092
174/261
2017/0194721 A1* 7/2017 Fan ......................... H01R 4/04

* cited by examiner

MANUFACTURING METHOD OF CONNECTOR STRUCTURE

CROSS-REFERENCE TO RELATED APPLICATION

This application claims the priority benefit of China application serial no. 201810677328.5, filed on Jun. 27, 2018. The entirety of the above-mentioned patent application is hereby incorporated by reference herein and made a part of this specification.

BACKGROUND

Technical Field

The disclosure is related to a connector structure, and particularly to a manufacturing method of a connector structure.

Description of Related Art

In recent years, along with advancement of technical industries, electronic products such as notebook computer, tablet PC and smart phone are frequently used in our daily life. The form and function of electronic products are varied; therefore, a circuit board applied to electronic products plays an important role in related techniques. In order to increase application of circuit board, different types of connectors may be disposed on the circuit board so that the circuit board can be connected with other electronic elements or a plurality of circuit boards. For example, some of existing connectors can be directly fabricated on the circuit board in the process of manufacturing circuit board.

Typical connector structures include a plurality of terminals respectively disposed on two opposite surfaces of a dielectric layer, wherein each of the terminals includes a fixing end portion fixed on the dielectric layer and a free end portion suspended over the dielectric layer, and a portion of the terminal on one of the surfaces of the dielectric layer is aligned with another portion of the terminal on another surface of the dielectric layer in a vertical direction respectively. For two of the terminals respectively disposed on two opposite surfaces of the dielectric layer and aligned with each other, a conductive via is provided in an orthogonal projection range of two free end portions of the two terminals on the dielectric layer for electrically connecting the two terminals. Being limited by manufacturing process, a metal layer is formed adjacent to the conductive via and not removable. First of all, based on the relative positions of the two terminals and the conductive via as well as the metal layer, the capacitance effect generated in typical connector structure is not likely to be reduced and thus making it difficult to transmit high-frequency signal. Moreover, it is difficult to reduce the manufacturing cost of typical connector structure due to formation of metal layer.

SUMMARY

The disclosure is related to a manufacturing method of a connector structure, which has low manufacturing cost and is advantageous for high-frequency signal transmission.

According to an embodiment of the disclosure, a manufacturing method of a connector structure includes the following steps. First of all, a dielectric layer is provided with a first surface and a second surface opposite to each other. Next, a first adhesive layer is formed on the first surface and a second adhesive layer is forming on the second surface. Thereafter, at least one conductive elastic cantilever and at least one second conductive elastic cantilever are provided, wherein the first conductive elastic cantilever includes a first fixing end portion and a first free end portion, and the second conductive elastic cantilever includes a second fixing end portion and a second free end portion. Then, the first fixing end portion of the first conductive elastic cantilever is fixed on the first adhesive layer, and the second fixing end portion of the second conductive elastic cantilever is fixed on the second adhesive layer, wherein the first fixing end portion is aligned with the second fixing end portion. Afterward, at least one conductive via penetrating through the first fixing end portion, the first adhesive layer, the dielectric layer, the second adhesive layer and the second fixing end portion is formed such that the first conductive elastic cantilever and the second conductive elastic cantilever are electrically connected through the conductive via.

According to an embodiment of the disclosure, the manufacturing method of the connector structure further includes the following steps. A first protective layer is formed on the first adhesive layer, and a second protective layer is formed on the second adhesive layer, wherein at least a portion of the first fixing end portion is covered by the first protective layer, and at least a portion of the second fixing end portion is covered by the second protective layer.

According to an embodiment of the disclosure, the conductive via further penetrates through the first protective layer and the second protective layer.

According to an embodiment of the disclosure, the first adhesive layer has at least one first opening, and the second adhesive layer has at least one second opening aligned with the first opening, the first free end portion of the first conductive elastic cantilever is suspended over the first opening, and the second free end portion of the second conductive elastic cantilever is suspended beneath the second opening.

According to an embodiment of the disclosure, the first protective layer has at least one third opening communicating with the first opening, and the second adhesive layer has at least one fourth opening communicating with the second opening. The first free end portion of the first conductive elastic cantilever is extended from the third opening in a direction away from the dielectric layer, and the second free end portion of the second conductive elastic cantilever is extended from the fourth opening in a direction away from the dielectric layer.

According to an embodiment of the disclosure, two opposite end portions of the conductive via are respectively covered by the first protective layer and the second protective layer.

Based on the above, the manufacturing method of the connector structure of the disclosure is performed by forming the conductive via at a position where the conductive elastic cantilever is jointed to the dielectric layer to avoid that unnecessary metal layer is formed on the dielectric layer, thereby reducing the manufacturing cost. On the other hand, on basis that there is no conductive via or metal layer in the orthogonal projection range of the free end of the conductive elastic cantilever on the dielectric layer, the capacitance effect in the connector structure is significantly reduced, which is advantageous for high-frequency signal transmission.

To make the above features and advantages of the disclosure more comprehensible, embodiments accompanied with drawings are described in detail as follows.

BRIEF DESCRIPTION OF THE DRAWINGS

The accompanying drawings are included to provide a further understanding of the present invention, and are incorporated in and constitute a part of this specification. The drawings illustrate embodiments of the invention and, together with the description, serve to explain the principles of the invention.

DESCRIPTION OF DISCLOSED EMBODIMENTS

Figure 1:
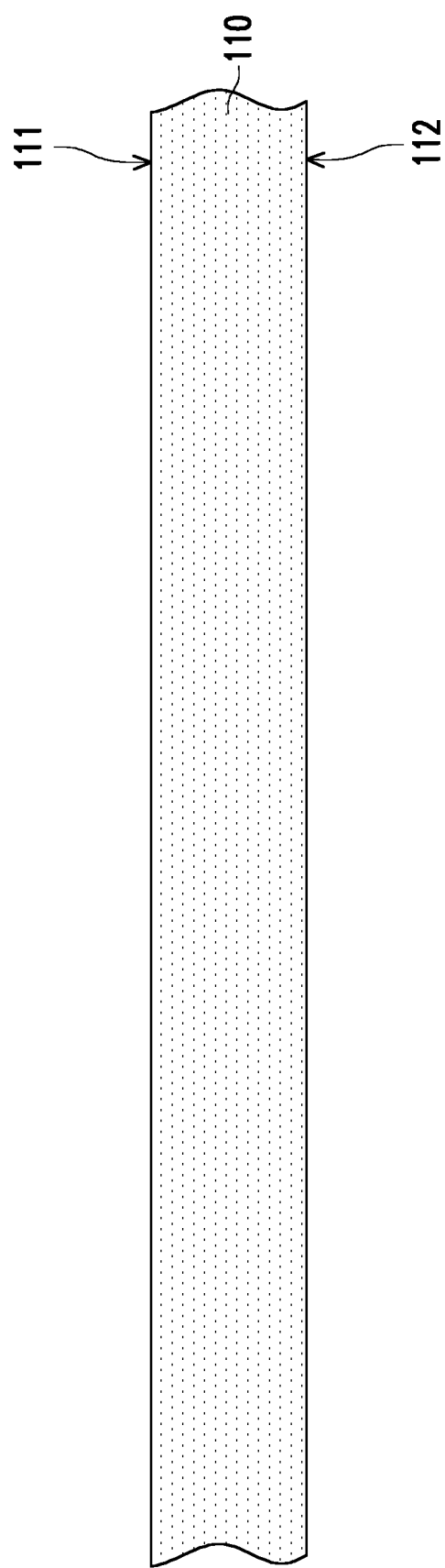
FIG. 1 to FIG. 4 are schematic flowcharts of a manufacturing process of a connector structure according to an embodiment of the disclosure.

FIG. 1 to FIG. 4 are schematic flowcharts of a manufacturing process of a connector structure according to an embodiment of the disclosure. Referring to FIG. 1, in the embodiment, a dielectric layer 110 is provided, which may be formed of polyimide (PI) or polyethylene terephthalate (PET), the disclosure is not limited thereto. Specifically, the dielectric layer 110 has a first surface 111 and a second surface 112 opposite to each other, and the first surface 111 and the second surface 112 are parallel with each other, for example. Next, referring to FIG. 2, a first adhesive layer 120 is formed on the first surface 111, and a second adhesive layer 130 is formed on the second surface 112.

In an embodiment, the first adhesive layer 120 may be completely formed on the first surface 111; then a portion of the first adhesive layer 120 is removed to form at least one first opening 121 (a plurality of first openings are shown for exemplary purpose) such that a portion of the first surface 111 is exposed to the outside. On the other hand, the second adhesive layer 130 may be completely formed on the second surface 112, and then a portion of the second adhesive layer 130 is removed to form at least one second opening 131 (a plurality of second openings are shown for exemplary purpose) such that a portion of the second surface 112 is exposed to the outside. In another embodiment, the first adhesive layer 120 may be partially formed on the first surface 111; a region of the first surface 111 that is not covered by the first adhesive layer 120 forms at least one first opening 121 (a plurality of first openings are shown for exemplary purpose). On the other hand, the second adhesive layer 130 may be partially formed on the second surface 112; a region of the second surface 112 that is not covered by the second adhesive layer 130 forms at least one second opening 131 (a plurality of second openings are shown for exemplary purpose).

Figure 2:
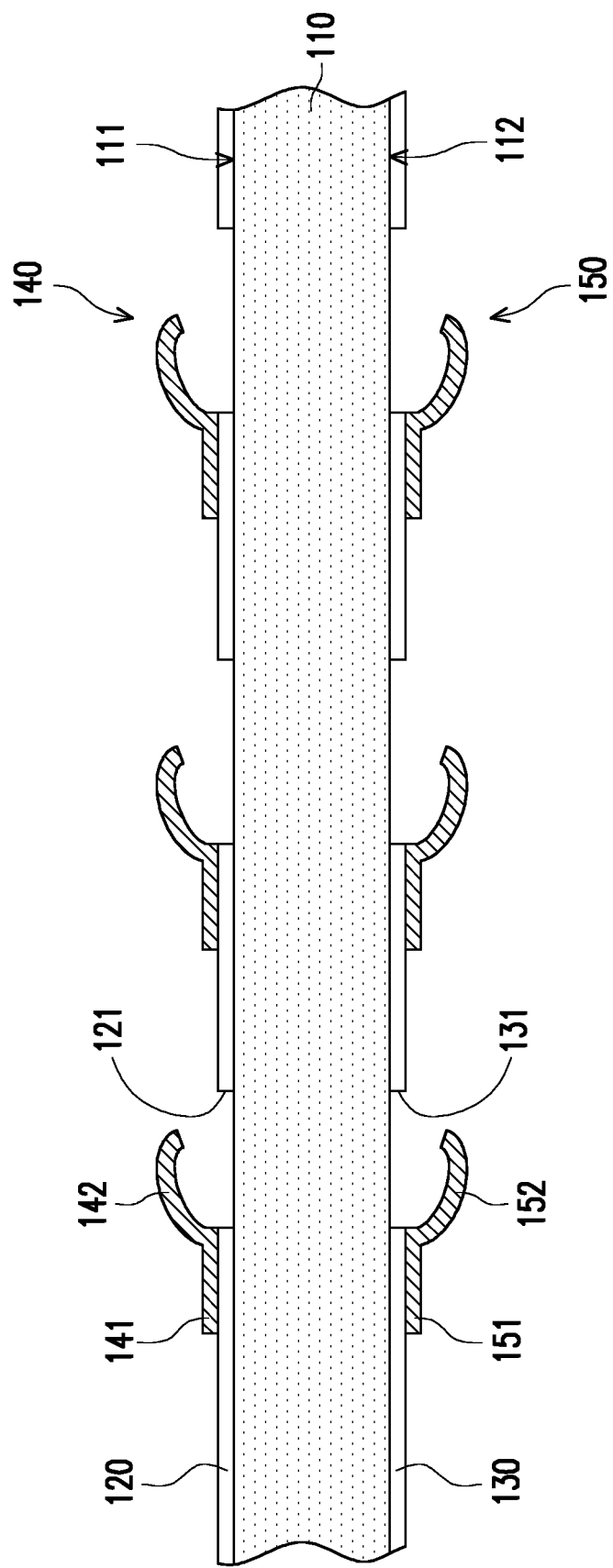

Referring to FIG. 2, in the embodiment, the first openings 121 are respectively aligned with the second openings 131 in a direction perpendicular to the first surface 111 or the second surface 112. In other words, one first opening 121 is aligned with one second opening 131. After the first adhesive layer 120 is formed on the first surface 111 and the second adhesive layer 130 is formed on the second surface 112, at least one first conductive elastic cantilever 140 (a plurality of which are shown for exemplary purpose) and at least one second conductive elastic cantilever 150 (a plurality of which are shown for exemplary purpose) are provided, wherein the number of the first conductive elastic cantilevers 140 is equal to the number of the first openings 121, and the number of the second conductive elastic cantilevers 150 is equal to the number of the second openings 131. Each of the first conductive elastic cantilevers 140 includes a first fixing end portion 141 and a first free end portion 142, and each of the second conductive elastic cantilevers 150 includes a second fixing end portion 151 and a second free end portion 152. Thereafter, the first fixing end portion 141 of each of the first conductive elastic cantilevers 140 is fixed on the first adhesive layer 120, and the second fixing end portion 151 of each of the second conductive elastic cantilevers 150 is fixed on the second adhesive layer 130.

In a set of first conductive elastic cantilever 140 and second conductive elastic cantilever 150 aligned with each other, the first fixing end portion 141 is aligned with the second fixing end portion 151. In other words, the orthogonal projection of the first fixing end portion 141 on the dielectric layer 110 overlaps the orthogonal projection of the second fixing end portion 151 on the dielectric layer 110. On the other hand, the first free end portion 142 of each of the first conductive elastic cantilevers 140 is suspended over the corresponding first opening 121, and the second free end portion 152 of each of the second conductive elastic cantilevers 150 is suspended beneath the second opening 131. In a set of first conductive elastic cantilever 140 and second conductive elastic cantilever 150 aligned with each other, the first free end portion 142 is aligned with the second free end portion 152. In other words, the orthogonal projection of the first free end portion 142 on the dielectric layer 110 overlaps the orthogonal projection of the second free end portion 152 on the dielectric layer 110, and respectively fall within the corresponding first opening 121 and the corresponding second opening 131.

Figure 3:
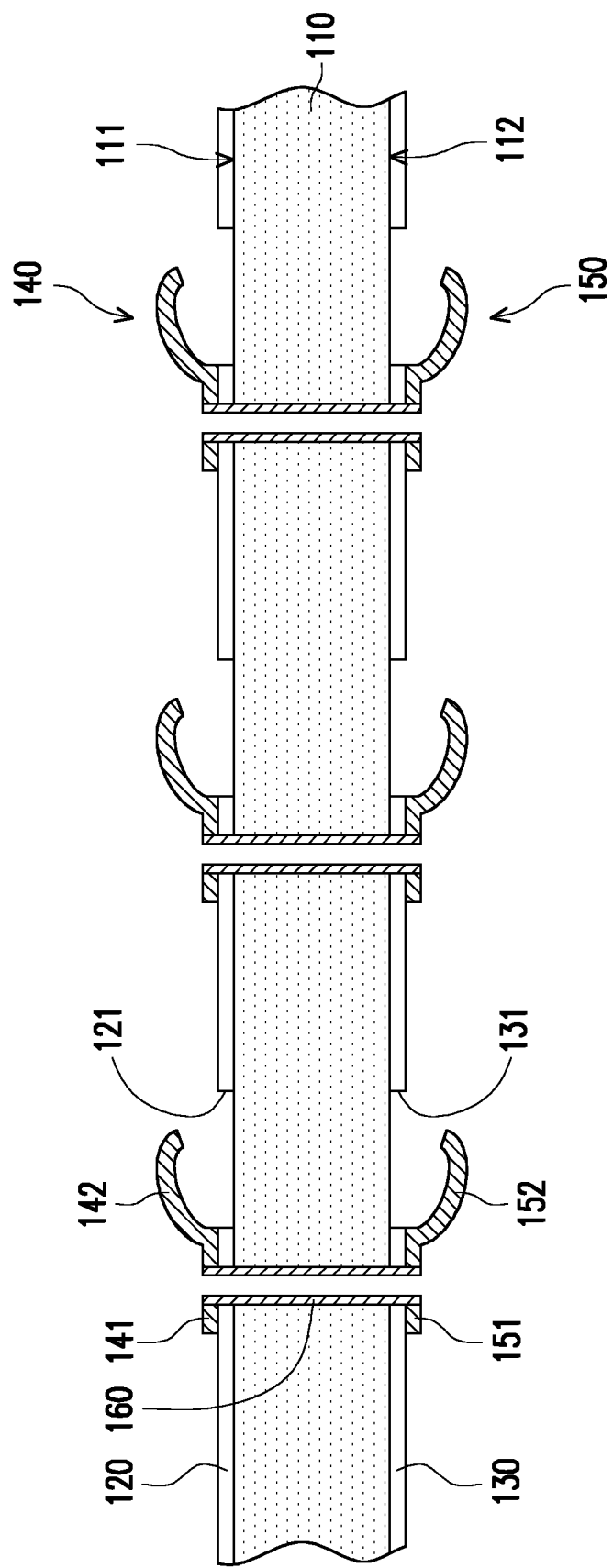

Next, referring to FIG. 3, through the means of laser drilling or mechanical drilling, a conductive via 160 penetrating through each of the first fixing end portions 141, the first adhesive layer 120, the dielectric layer 110, the second adhesive layer 130 and a via corresponding to the second fixing end portion 151 is formed by plating the via, such that the corresponding first conductive elastic cantilever 140 and the second conductive elastic cantilever 150 are electrically connected through each of the conductive vias 160. For example, the conductive vias 160 and the first openings 121 are arranged alternately in a direction parallel with the first surface 111 or the second surface 112, and the conductive vias 160 and the second openings 131 are arranged alternately in the direction parallel with the first surface 111 or the second surface 112. Since each of the conductive vias 160 does not fall within the orthogonal projection range of the corresponding first free end portion 142 and the second free end portion 152 on the dielectric layer 110, and there is no unnecessary metal layer in the orthogonal projection range of each of the first free end portion 142 and the corresponding second free end portion 152 on the dielectric layer 110, not only that the capacitance effect in the connector structure 100 (see FIG. 4) that is obtained through subsequent manufacturing process can be significantly reduced, which is also advantageous for high-frequency signal transmission, and the manufacturing cost can be reduced as well.

Figure 4:
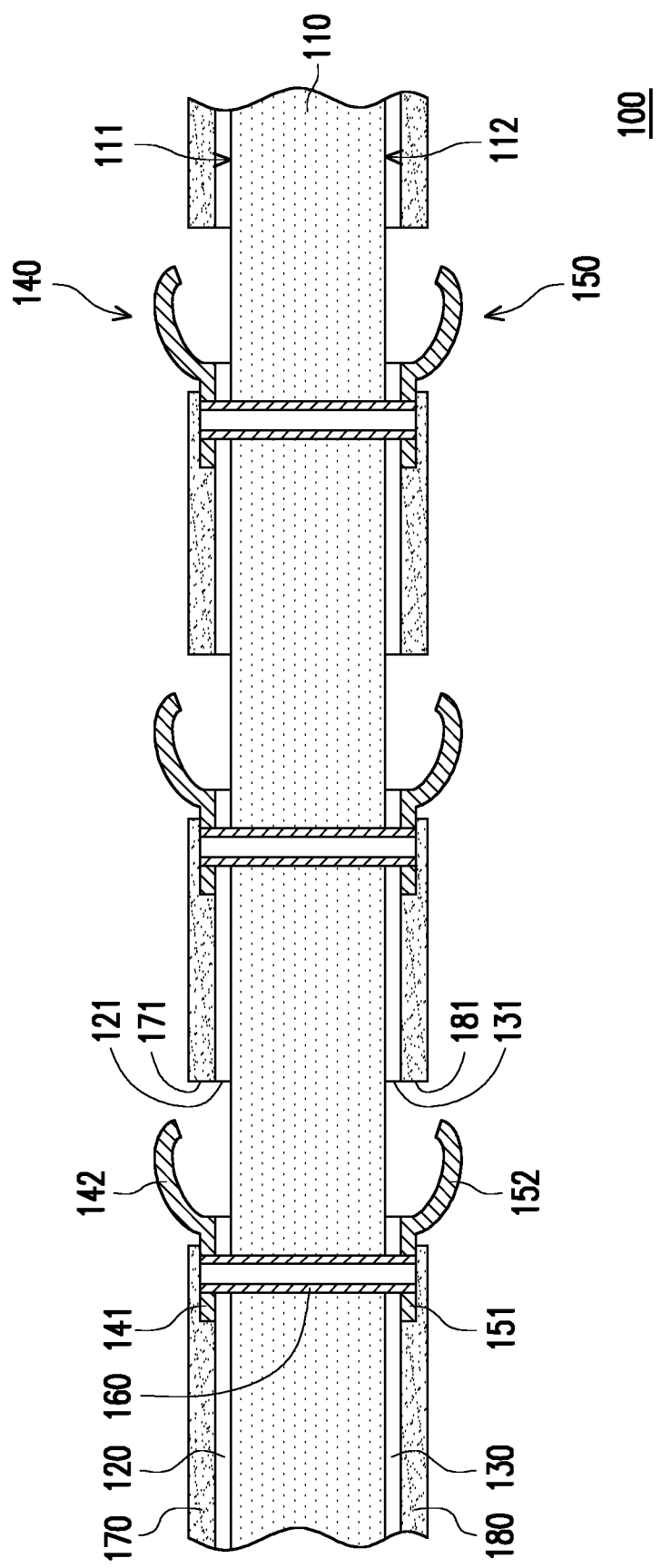

Moreover, referring to FIG. 4, a first protective layer 170 is formed on the first adhesive layer 120, and the first openings 121 in the first adhesive layer 120 are not covered by the first protective layer 170. Meanwhile, a second protective layer 180 is formed on the second adhesive layer 130, and the second openings 131 in the second adhesive layer 130 are not covered by the second protective layer 180. In the embodiment, at least a portion of each of the first fixing end portion 141 is covered by the first protective layer 170, and at least a portion of each of the second fixing end portion 151 is covered by the second protective layer 180, such that the first fixing end portions 141 and the second fixing end portions 151 are not affected by high temperature, humidity, pollution or acid. On the other hand, two opposite end portions of each of the conductive vias 160 are respectively covered by the first protective layer 170 and the second protective layer 180 such that the conductive vias 160 are not affected by high temperature, humidity, pollution or acid.

A region of the first opening 121 not covered by the first protective layer 170 forms a third opening 171, and a region of the second opening 131 not covered by the second protective layer 180 forms a fourth opening 181. Each of the third openings 171 communicates with the corresponding first opening 121, and each of the fourth openings 181 communicates with the second opening 131. Specifically, the first free end portion 142 of each of the first conductive elastic cantilevers 140 is extended from the corresponding third opening 171 in a direction away from the dielectric layer 110, and the second free end portion 152 of each of the second conductive elastic cantilevers 150 is extended from the corresponding fourth opening 181 in a direction away from the dielectric layer 110 for electrically connecting other electronic components subsequently. So far, the fabrication of the connector structure 110 is substantially completed. In some embodiments, the connector structure 100 may not have the first protective layer 170 and the second protective layer 180.

Figure 5:
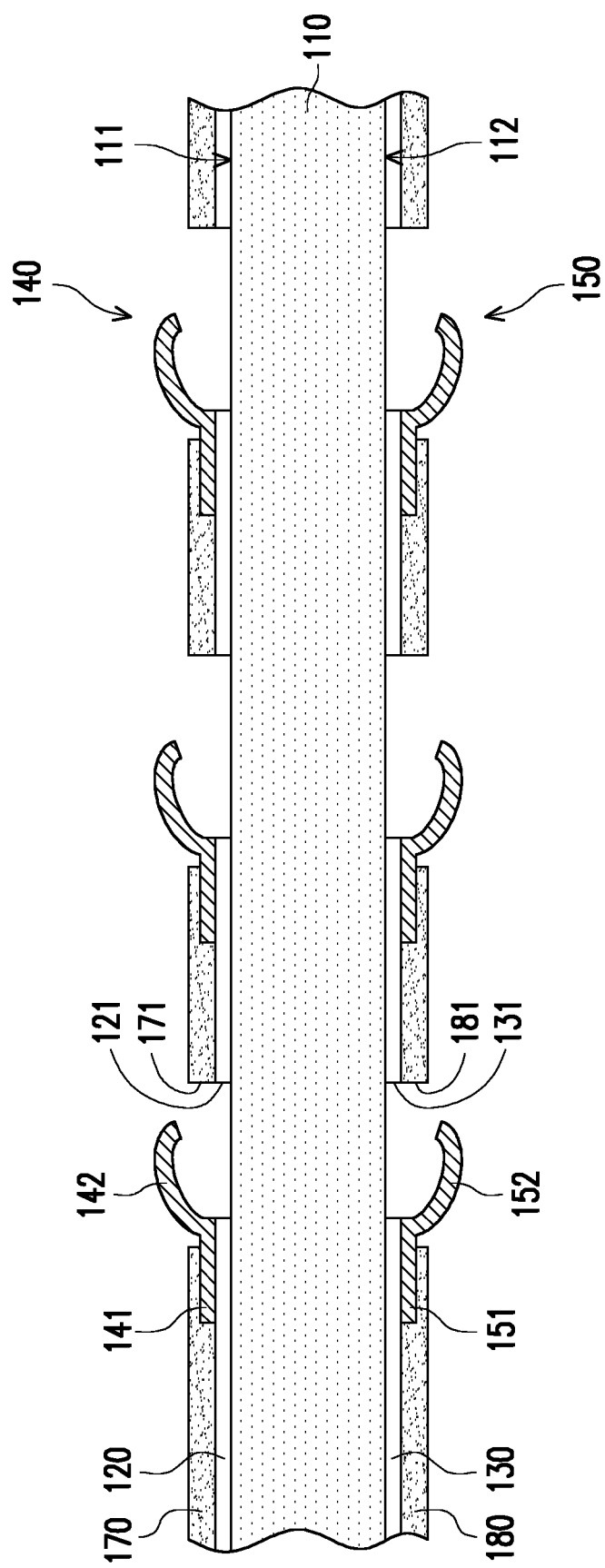
FIG. 5 and FIG. 6 are schematic flowcharts of a manufacturing process of a connector structure according to another embodiment of the disclosure.
Figure 6:
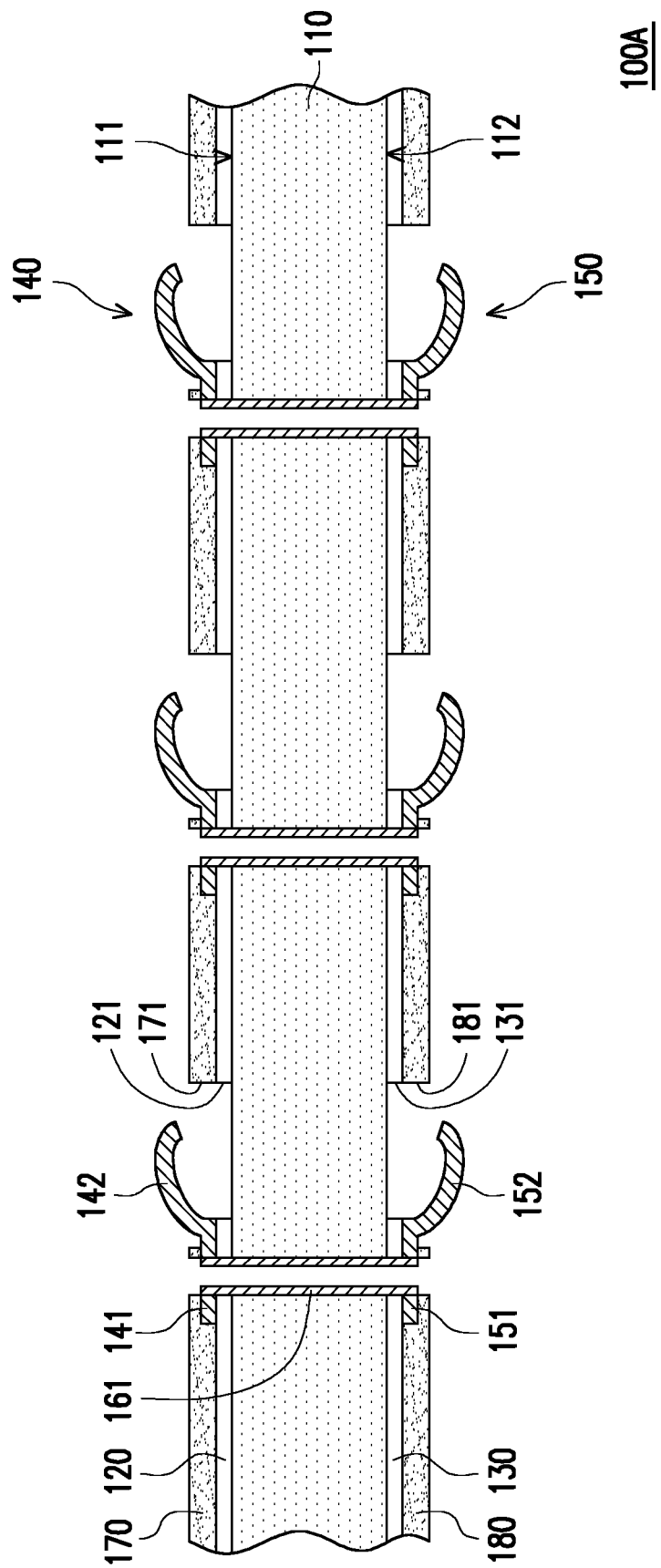

FIG. 5 and FIG. 6 are schematic flowcharts of a manufacturing process of a connector structure according to another embodiment of the disclosure. Referring to FIG. 5 and FIG. 6, the manufacturing steps of a connector structure 100A of the embodiment are partially the same as the manufacturing steps of the connector structure 100 in the foregoing embodiment; that is, the manufacturing steps shown in FIG. 1 and FIG. 2 are continued after the manufacturing steps shown in FIG. 2. The difference of the manufacturing steps of the connector structure 100A in the embodiment is that, as shown in FIG. 5, the first protective layer 170 is formed on the first adhesive layer 120 first, and the first openings 121 in the first adhesive layer 120 are not covered by the first protective layer 170. Moreover, the second adhesive layer 130 is formed on the second protective layer 180, and the second openings 131 in the second adhesive layer 130 are not covered by the second protective layer 180. At least a portion of each of the first fixing end portions 141 is covered by the first protective layer 170, at least a portion of each of the second fixing end portions 151 is covered by the second protective layer 180, such that the first fixing end portions 141 and the second fixing end portions 151 are not affected by high temperature, humidity, pollution or acid.

A region of the first opening 121 not covered by the first protective layer 170 forms the third opening 171, and a region of the second opening 131 not covered by the second protective layer 180 forms the fourth opening 181. Each of the third openings 171 communicates with the corresponding first opening 121, and each of the fourth openings 181 communicates with the second opening 131. Specifically, the first free end portion 142 of each of the first conductive elastic cantilevers 140 is extended from the corresponding third opening 171 in a direction away from the dielectric layer 110, and the second free end portion 152 of each of the second conductive elastic cantilevers 150 is extended from the corresponding fourth opening 181 in a direction away from the dielectric layer 110 for electrically connecting other electronic components subsequently.

Thereafter, as shown in FIG. 6, by the means of laser drilling or mechanical drilling, the conductive via 161 penetrating through the first protective layer 170, each of the first fixing end portions 141, the first adhesive layer 120, the dielectric layer 110, the second adhesive layer 130, the corresponding second fixing end portion 151 and the via of the second protective layer 180 is formed by plating the via, such that the corresponding first conductive elastic cantilever 140 and the second conductive elastic cantilever 150 are electrically connected through each of the conductive vias 161. For example, the conductive vias 161 and the first openings 121 are arranged alternately in a direction parallel with the first surface 111 or the second surface 112, and the conductive vias 161 and the second openings 131 are arranged alternately in the direction parallel with the first surface 111 or the second surface 112. Since each of the conductive vias 160 does not fall within the orthogonal projection range of the corresponding first free end portion 142 and the second free end portion 152 on the dielectric layer 110, and there is no unnecessary metal layer in the orthogonal projection range of each of the first free end portions 142 and the corresponding second free end portion 152 on the dielectric layer 110, not only that the capacitance effect in the connector structure 100A that is manufactured can be significantly reduced, which is also advantageous for high-frequency signal transmission, and the manufacturing cost can be reduced as well.

In summary, the manufacturing method of the connector structure of the disclosure is performed by forming the conductive via at a position where the conductive elastic cantilever is jointed to the dielectric layer to avoid that unnecessary metal layer is formed on the dielectric layer, thereby reducing the manufacturing cost. On the other hand, on basis that there is no conductive via or metal layer in the orthogonal projection range of the free end of the conductive elastic cantilever on the dielectric layer, the capacitance effect in the connector structure is significantly reduced, which is advantageous for high-frequency signal transmission.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A manufacturing method of a connector structure, comprising:
   providing a dielectric layer, having a first surface and a second surface opposite to each other;
   forming a first adhesive layer on the first surface, and forming a second adhesive layer on the second surface;
   providing at least one first conductive elastic cantilever and at least one second conductive elastic cantilever, wherein the first conductive elastic cantilever comprises a first fixing end portion and a first free end portion, and the second conductive elastic cantilever comprises a second fixing end portion and a second free end portion;
   fixing the first fixing end portion of the first conductive elastic cantilever on the first adhesive layer, and fixing the second fixing end portion of the second conductive elastic cantilever on the second adhesive layer, wherein the first fixing end portion is aligned with the second fixing end portion; and forming at least one conductive via penetrating through the first fixing end portion, the first adhesive layer, the dielectric layer, the second adhesive layer and at least one conductive via of the second fixing end portion, such that the first conductive elastic cantilever and the second conductive elastic cantilever are electrically connected through the conductive via.

2. The manufacturing method of the connector structure as recited in claim 1, further comprising:

forming a first protective layer on the first adhesive layer, and forming a second protective layer on the second adhesive layer, wherein at least one portion of the first fixing end portion is covered by the first protective layer, and at least one portion of the second fixing end portion is covered by the second protective layer.

3. The manufacturing method of the connector structure as recited in claim 2, wherein the conductive via further penetrates through the first protective layer and the second protective layer.

4. The manufacturing method of the connector structure as recited in claim 2, wherein the first adhesive layer has at least one first opening, and the second adhesive layer has at least one second opening aligned with the first opening, the first free end portion of the first conductive elastic cantilever is suspended over the first opening, and the second free end portion of the second conductive elastic cantilever is suspended beneath the second opening.

5. The manufacturing method of the connector structure as recited in claim 4, wherein the first protective layer has at least one third opening communicating with the first opening, and the second adhesive layer has at least one fourth opening communicating with the second opening, the first free end portion of the first conductive elastic cantilever is extended from the third opening in a direction away from the dielectric layer, and the second free end portion of the second conductive elastic cantilever is extended from the fourth opening in a direction away from the dielectric layer.

6. The manufacturing method of the connector structure as recited in claim 2, wherein two opposite end portions of the conductive via are respectively covered by the first protective layer and the second protective layer.

* * * * *